United States Patent
Chou

(10) Patent No.: US 8,486,794 B1
(45) Date of Patent: Jul. 16, 2013

(54) METHOD FOR MANUFACTURING SEMICONDUCTOR STRUCTURE

(75) Inventor: Ling-Chun Chou, Yunlin County (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 13/349,602

(22) Filed: Jan. 13, 2012

(51) Int. Cl.
*H01L 21/336* (2006.01)

(52) U.S. Cl.
USPC ............ 438/300; 257/E21.431; 257/E21.623; 257/E21.632; 257/E21.634; 257/E21.64; 438/199; 438/266; 438/283

(58) Field of Classification Search
USPC .................. 257/E21.431, E21.623, E21.632, 257/E21.634, E21.64; 438/199, 226, 283, 438/300
See application file for complete search history.

(56) References Cited

U.S. PATENT DOCUMENTS

| 2008/0197420 A1* | 8/2008 | Yeh et al. ....................... 257/369 |
| 2008/0303062 A1* | 12/2008 | Mimura et al. ................ 257/190 |
| 2011/0012197 A1 | 1/2011 | Hung et al. |

* cited by examiner

*Primary Examiner* — Asok K Sarkar
(74) *Attorney, Agent, or Firm* — WPAT, PC; Justin King

(57) ABSTRACT

A method for manufacturing a semiconductor structure is provided. The method includes following steps. A patterned gate layer is formed on a semiconductor substrate. A compensation layer is formed on the semiconductor substrate outside the patterned gate layer. A trench is formed in the compensation layer and the semiconductor substrate. An epitaxial layer is formed in the trench. The step for forming the compensation layer is between the step for forming the patterned gate layer and the step for forming the epitaxial layer.

18 Claims, 14 Drawing Sheets

METHOD FOR MANUFACTURING SEMICONDUCTOR STRUCTURE

BACKGROUND

1. Field of the Invention

The disclosure relates in general to a method for manufacturing a semiconductor structure, and more particularly to a method for manufacturing a semiconductor structure, comprising a step for forming a compensation layer.

2. Description of the Related Art

With a trend of shrinking a line width of a semiconductor process, a size of a semiconductor structure, comprising for example a MOS transistor or a memory array, etc., has been scaled down. However, an accurate process is necessary for obtaining a fine critical size of a semiconductor process. Otherwise, a semiconductor device would have a low efficiency resulted from a process shift or a side effect in a manufacturing step.

SUMMARY

A method for manufacturing a semiconductor structure is provided. The method includes following steps. A patterned gate layer is formed on a semiconductor substrate. A compensation layer is formed on the semiconductor substrate outside the patterned gate layer. A trench is formed in the compensation layer and the semiconductor substrate. An epitaxial layer is formed in the trench. The step for forming the compensation layer is between the step for forming the patterned gate layer and the step for forming the epitaxial layer.

A method for manufacturing a semiconductor structure is provided. The method includes following steps. A patterned gate layer and a cap layer are formed on a semiconductor substrate. The cap layer is on the patterned gate layer. A sidewall layer is formed on sidewalls of the patterned gate layer and the cap layer. The sidewall layer is removed. A compensation layer is formed on the semiconductor substrate outside the patterned gate layer. The cap layer is removed. The step for forming the compensation layer is between the step for removing the sidewall layer and the step for removing the cap layer.

The above and other aspects of the disclosure will become better understood with regard to the following detailed description of the non-limiting embodiment(s). The following description is made with reference to the accompanying drawings.

DETAILED DESCRIPTION

First Embodiment

Figure 1:
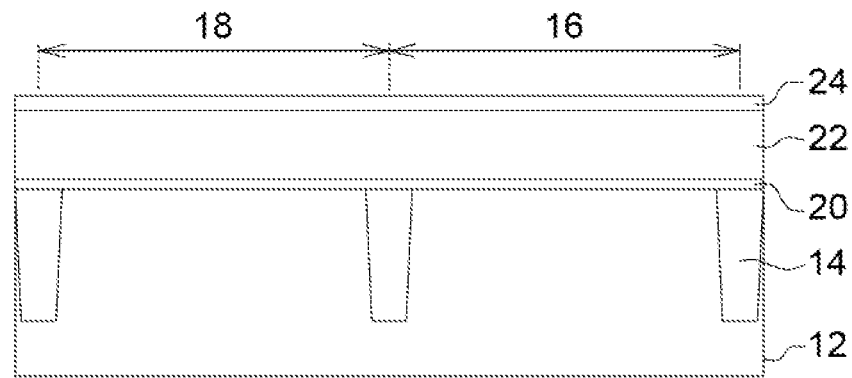
FIG. 1 to FIG. 7 illustrate a method for manufacturing a semiconductor structure in one embodiment.

FIG. 1 to FIG. 7 illustrate a method for manufacturing a semiconductor structure in a first embodiment. Referring to FIG. 1, a STI (shallow trench isolation structure) 14 is formed in a semiconductor substrate 12 for defining an active region 16 and an active region 18. For example, the semiconductor substrate 12 comprises silicon.

Referring to FIG. 1, a dielectric layer 20, a conductive layer 22 and a film layer 24 are formed on the semiconductor substrate 12. The dielectric layer 20 may comprise an oxide or a nitride, such as silicon oxide (SiO2), silicon oxynitride (SiON) or silicon nitride (SiN), or a high-K material, or a combination thereof. The high-K material may comprise a metal oxide layer, such as a rare earth metal oxide layer, selected from a group consisting of hafnium oxide (HfO2), hafnium silicon oxide (HfSiO), hafnium silicon oxynitride (HfSiON), aluminum oxide (AlO), lanthanum oxide (La2O3), lanthanum aluminum oxide (LaAlO), tantalum oxide (Ta2O3), zirconium oxide (ZrO2), zirconium silicon oxide (ZrSiO), hafnium zirconium oxide (HfZrO), strontium bismuth tantalate (SrBi2Ta2O9, SBT), lead zirconate titanate (PbZrxTi1-xO3, PZT), barium strontium titanate (BaxSr1-xTiO3, BST), and etc. The conductive layer 22 may comprise an un-doped polysilicon, a doped polysilicon, a metal, a metal compound, a metal silicide, or an optional combination thereof. The film layer 24 may be a dielectric material. For example, the dielectric material comprises silicon nitride, silicon oxide, silicon oxynitride, silicon carbide, or an optional combination thereof. In some embodiments, the film layer 24 is omitted.

Figure 2:
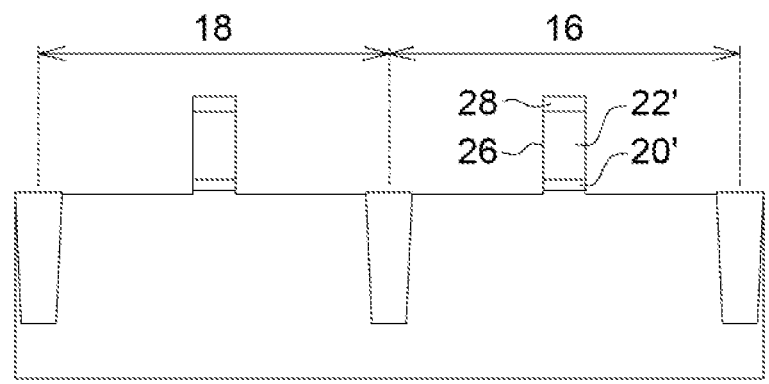

The film layer 24 is patterned for forming a cap layer 28 as shown in FIG. 2. In addition, the conductive layer 22 and the dielectric layer 20 are patterned for forming a patterned gate layer 26 as shown in FIG. 2. The patterned gate layer 26 comprises a patterned conductive layer 22' and a patterned dielectric layer 20'. In embodiments, the cap layer 28 and the patterned gate layer 26 are formed by an etching step using a patterned mask layer (not shown). Then the mask layer is removed. In some embodiments, the patterned dielectric layer 20' is used as an etching stop layer. The cap layer 28 may be used as a mask layer.

Figure 3:
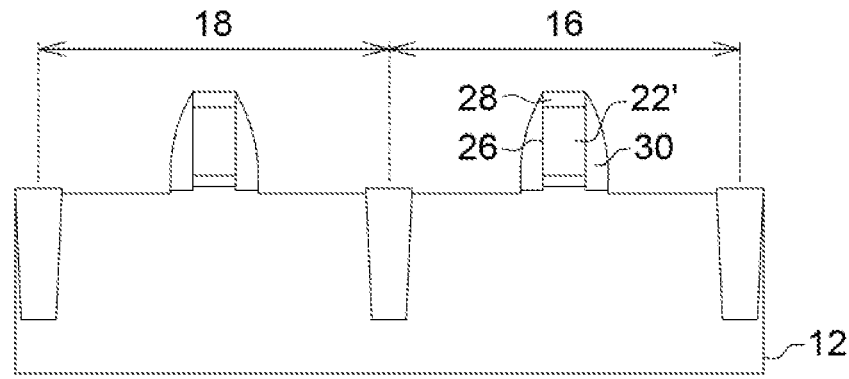

Referring to FIG. 3, a spacer 30 is formed on sidewalls of the patterned gate layer 26 and the cap layer 28. For example, a method for forming the spacer 30 comprises forming a material layer (not shown) on the semiconductor substrate 12, the patterned gate layer 26 and the cap layer 28. Then a portion of the material layer is removed by an etching step. A remained portion of the material layer forms the spacer 30. The material layer may be a single-layer dielectric film or a multi-layer film composed of various kinds of dielectric materials. In other words, the spacer 30 may be formed by a single-layer dielectric film or a multi-layer film composed of various kinds of dielectric materials. In one embodiment, before the spacer 30 is formed, a thermal oxide (not shown) such as SiO2 is formed on the sidewall of the patterned conductive layer 22'. It can repair defects generated in the etching steps.

Figure 4:
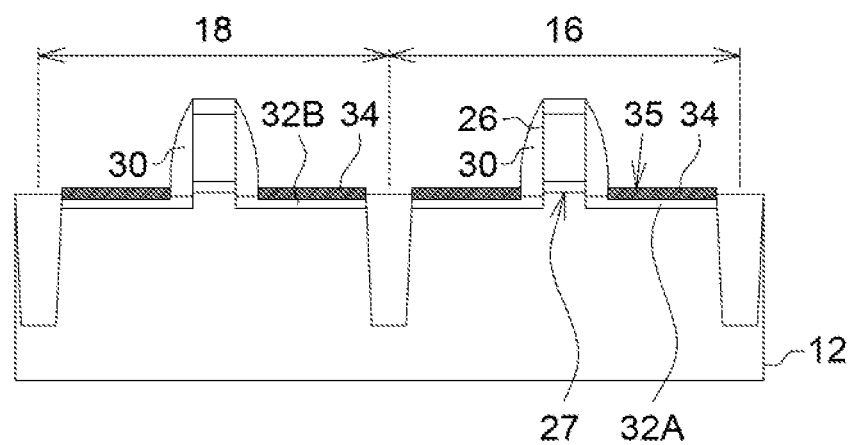
Figure 5:
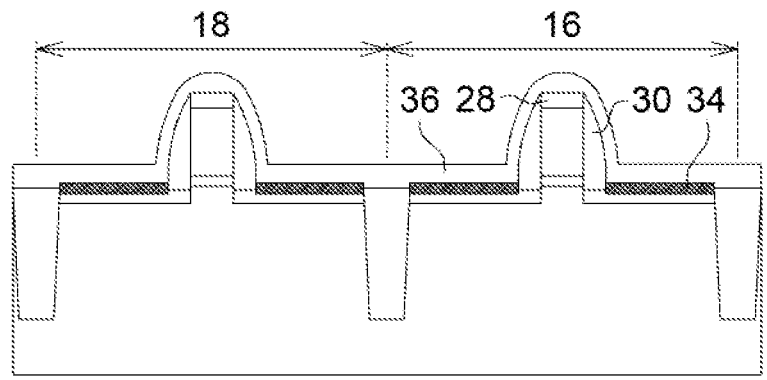

Referring to FIG. 4, a compensation layer 34 is formed on the semiconductor substrate 12. The compensation layer 34 is an epitaxial material grown from the semiconductor substrate 12. The compensation layer 34 comprises a silicon containing material such as silicon, SiGe, SiC, doped silicon, etc. For example, the compensation layer 34 comprises silicon. The patterned gate layer 26 and the semiconductor substrate 12 have an interface 27 therebetween. A top surface of the compensation layer 34 is higher than or as high as the interface 27. The compensation layer 34 can compensate losses of the semiconductor substrate 12 generated in the earlier etching steps for removing the materials, such as the step for patterning the film layer 24, the dielectric layer 20 and the conductive layer 22, or the removing step in the step for forming the spacer 30. Otherwise, a portion of the compensation layer 34 is expected to be a loss portion generated in the later steps for removing the materials, such as a step for removing a material layer 36 as shown in FIG. 5, or a removing step in a step for forming the spacer 46.

Referring to FIG. 4, a lightly doped region 32A is formed in the semiconductor substrate 12 in the active region 16. In addition, a lightly doped region 32B is formed in the semiconductor substrate 12 in the active region 18. Sequence of the step for forming the lightly doped region 32A and the step for forming the lightly doped region 32B is not limited. The lightly doped region 32B may be formed after the lightly doped region 32A. Alternatively, the lightly doped region 32B may be formed before the lightly doped region 32A.

Referring to FIG. 4, in one embodiment, the lightly doped region 32A and the lightly doped region 32B are formed after the compensation layer 34 is formed. In other embodiments, the lightly doped region 32A and the lightly doped region 32B are formed before the compensation layer 34 is formed.

Referring to FIG. 4, the lightly doped region 32A may be formed by doping the semiconductor substrate 12 (and the compensation layer 34) with using the spacer 30 in the active region 16 and a patterned mask layer (not shown) covering the whole active region 18 as a mask. Then, the mask layer is removed. The lightly doped region 32B may be formed by doping the semiconductor substrate 12 (and the compensation layer 34) with using the spacer 30 in the active region 18 and a patterned mask layer (not shown) covering the whole active region 16 as a mask. Then, the mask layer is removed.

Referring to FIG. 5, the material layer 36 is formed on the cap layer 28, the spacer 30, and the compensation layer 34. For example, the material layer 36 comprises silicon nitride.

Figure 6:
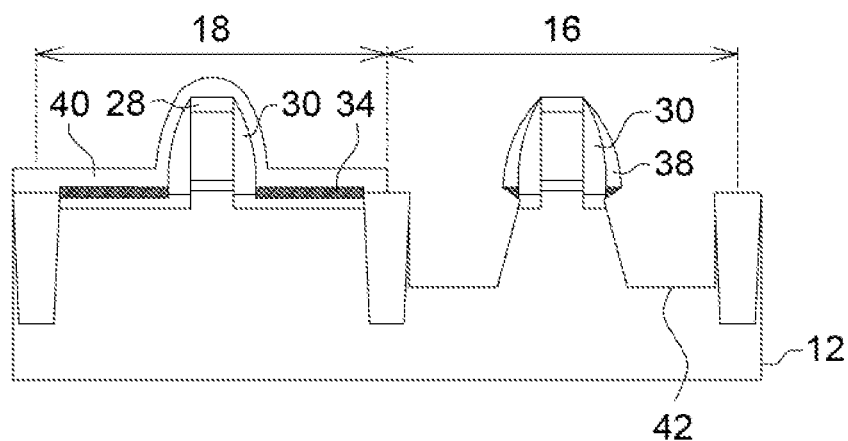

Referring to FIG. 6, a sidewall layer 38 is formed on a sidewall of the spacer 30 in the active region 16 by an etching step for removing a portion of the material layer 36 with using a patterned mask layer (not shown) covering the whole active region 18. A remained portion of the material layer 36 on the cap layer 28, the spacer 30, and the compensation layer 34 in the active region 18 forms a material layer 40. Then the mask layer is removed. The etching step for removing the material layer 36 etches out a trench 42 in the semiconductor substrate 12 simultaneously.

Figure 7:
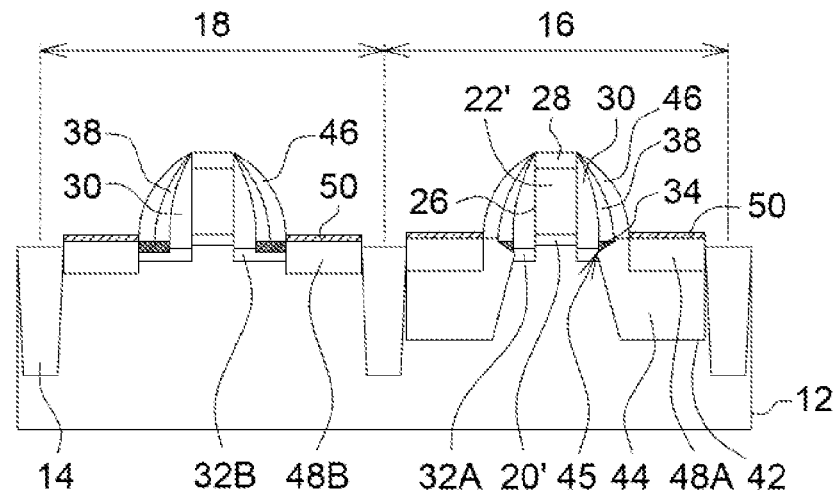

Referring to FIG. 7, an epitaxial layer 44 is formed in the trench 42. In embodiments, before the epitaxial growth step, a pre-backing step with using a hydrogen gas is performed. The epitaxial growth step and the pre-backing step are performed in-situ. The epitaxial layer 44 comprises a doped material such as SiGe or SiC. For example, the epitaxial layer 44 may be composed by a buffer layer having a low dopant (such as Ge, B) concentration or no dopant, a bulk layer having a high dopant concentration, and a cap layer having a low dopant concentration or no dopant.

Referring to FIG. 7, a sidewall layer 138 is formed on a sidewall of the spacer 30 in the active region 18. A method for forming the sidewall layer 138 in the active region 18 comprises following steps. A portion of the material layer 40 shown in FIG. 6 is removed for forming the spacer 30 in the active region 18 shown in FIG. 17 by an etching step using a patterned mask layer (not shown) covering the whole active region 16 as a mask. Then the mask layer is removed.

Referring to FIG. 7, the spacer 46 is formed on a sidewall of the sidewall layer 38. A method for forming the spacer 46 may be similar to the method for forming the spacer 30, and thus is not described in detail herein.

Referring to FIG. 7, a heavily doped region 48A is formed in the epitaxial layer 44 in the active region 16. A heavily doped region 48B is formed in the semiconductor substrate 12 in the active region 18. The heavily doped region 48A may be formed by doping the epitaxial layer 44 with using the spacer 46 in the active region 16 and a patterned mask layer (not shown) covering the whole active region 18 as a mask. Then, the mask layer is removed. The heavily doped region 48B may be formed by doping the semiconductor substrate 12 with using the spacer 46 in the active region 18 and a patterned mask layer (not shown) covering the whole active region 16 as a mask. Then, the mask layer is removed.

Referring to FIG. 7, a metal silicide layer 50 is formed on the heavily doped region 48A and the heavily doped region 48B. The metal silicide layer 50 may be formed by a method comprising forming a metal cover layer (not shown) in the active region 16 and the active region 18. Then a metal silicide reaction is generated between the metal cover layer and the epitaxial layer 44 (and the semiconductor substrate 12) by an annealing step. Then, an un-reacted portion of the metal cover layer is removed.

In embodiments, semiconductor structures of different types are formed in the active region 16 and the active region 18, respectively. The lightly doped region 32A and the heavily doped region 48A in the active region 16 have a first type conductivity. The semiconductor substrate 12 in the active region 16 has a second type conductivity opposite to the first type conductivity. The lightly doped region 32B and the heavily doped region 48B in the active region 18 have the second type conductivity. The semiconductor substrate 12 in the active region 18 has the first type conductivity.

For example, a PMOS is formed in the active region 16, and a NMOS is formed in the active region 18, in which the first type conductivity is P type conductivity, and the second type conductivity is N type conductivity, and vice versa. In a case of a PMOS in the active region 16, the epitaxial layer 44 comprises SiGe. In a case of a NMOS in the active region 16, the epitaxial layer 44 comprises SiC. The lightly doped region 32A and the lightly doped region 32B are used as a LDD. The heavily doped region 48A and the heavily doped region 48B are used as a source/drain.

In some embodiments (not shown), the semiconductor structures in the active region 16 and the active region 18 may both have the epitaxial layers 44. In other embodiments (not shown), for example in a memory array, the STI 14 is omitted, and two adjacent gate structures use a common heavily doped region or epitaxial layer.

The patterned conductive layer 22' of the patterned gate layer 26 may be used as a gate electrode or a dummy gate. In a case of the patterned conductive layer 22' used as a gate electrode, a metal silicide may be formed on the patterned conductive layer 22'. The metal silicide may be an additional metal silicide formed after the cap layer 28 used as a mask layer is removed. In a case of the patterned conductive layer 22' used as a dummy gate, a barrier layer (not shown) such as TiN is formed between the patterned dielectric layer 20' and the patterned conductive layer 22'. In addition, the cap layer 28 is not removed before the patterned conductive layer 22' (the dummy gate) for preventing a formation of a metal silicide on the patterned conductive layer 22' (the dummy gate) that would make removing the patterned conductive layer 22' (the dummy gate) difficult.

In embodiments, the compensation layer 34 can compensate losses of the substrate material generated in the removing steps. Therefore, a PN junction of a device can be controlled at a predetermined position. A short channel effect and a drain induced barrier lowering (DIBL) can be avoided. Forming the compensation layer 34 also makes a protruding portion 45 of the epitaxial layer 44 close to a channel. Therefore, a super shallow junction (USL) can be obtained. In addition, the efficiency of the device is improved.

Second Embodiment

The second embodiment is different from the first embodiment in that the lightly doped regions in different active regions are respectively formed before and after the sidewall layer and the cap layer are removed. FIG. 8 to FIG. 11 illustrate a method for manufacturing a semiconductor structure in the second embodiment. An earlier process in this embodiment is similar to a process shown in FIG. 1 to FIG. 3, and thus is not described in detail herein.

Figure 8:
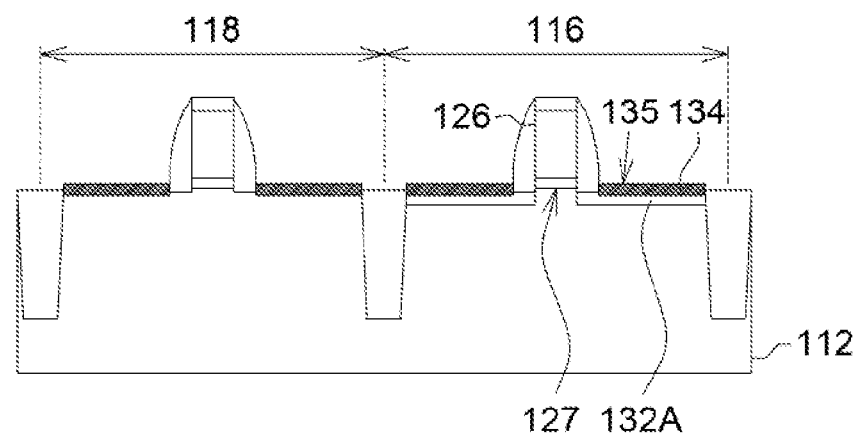
FIG. 8 to FIG. 11 illustrate a method for manufacturing a semiconductor structure in one embodiment

Referring to FIG. 8, the compensation layer 134 is formed on the semiconductor substrate 112. The compensation layer 134 is an epitaxial material grown from the semiconductor substrate 112. The compensation layer 134 comprises a silicon containing material such as silicon, SiGe, SiC, doped silicon, etc. The top surface 135 of the compensation layer 134 is higher than or as high as the interface 127 between the patterned gate layer 126 and the semiconductor substrate 112. The lightly doped region 132A is formed in the semiconductor substrate 112 in the active region 116.

Figure 9:
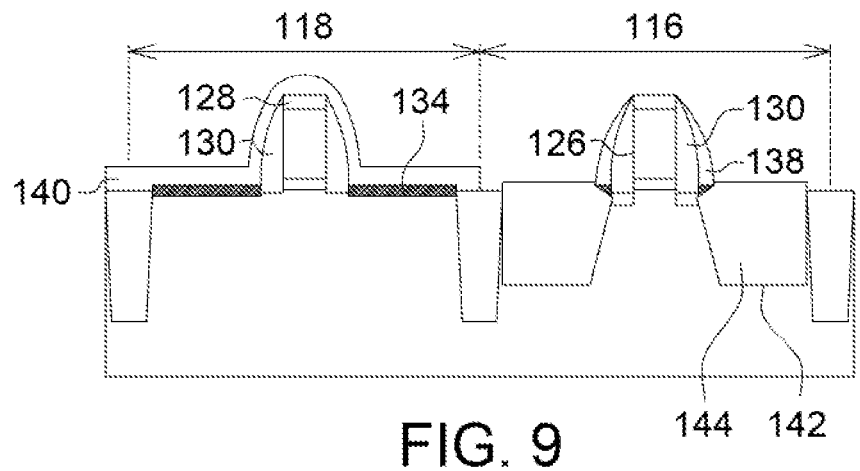

Referring to FIG. 9, the sidewall layer 138 is formed on the sidewall of the spacer 130, and the trench 142 is formed in the semiconductor substrate 112 in the active region 116. In addition, the material layer 140 is formed on the cap layer 128, the spacer 130, and the compensation layer 134 in the active region 118. The epitaxial layer 144 is formed in the trench 142.

Figure 10:
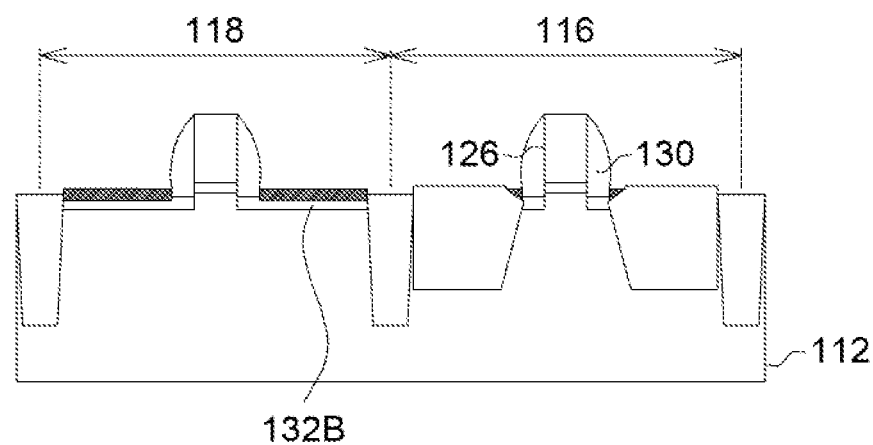

The sidewall layer 138, the material layer 140 and the cap layer 128 are removed by an etching step for forming the semiconductor structure as shown in FIG. 10. In one embodiment, the sidewall layer 138, the material layer 140 and the cap layer 128 have the same material such as silicon nitride, and are removed simultaneously in this etching step. In addition, this etching step may also remove a portion of the spacer 130 simultaneously, so that the spacer 130 is decreased to substantially lower slightly than or as high as the patterned gate layer 126.

Referring to FIG. 10, the lightly doped region 132B is then formed in the semiconductor substrate 112 in the active region 118. Since the lightly doped region 132B is formed after the cap layer 128 and the sidewall layer 138 (FIG. 9), the shadow effect can be avoided. Thus, the efficiency of the device can be improved.

Figure 11:
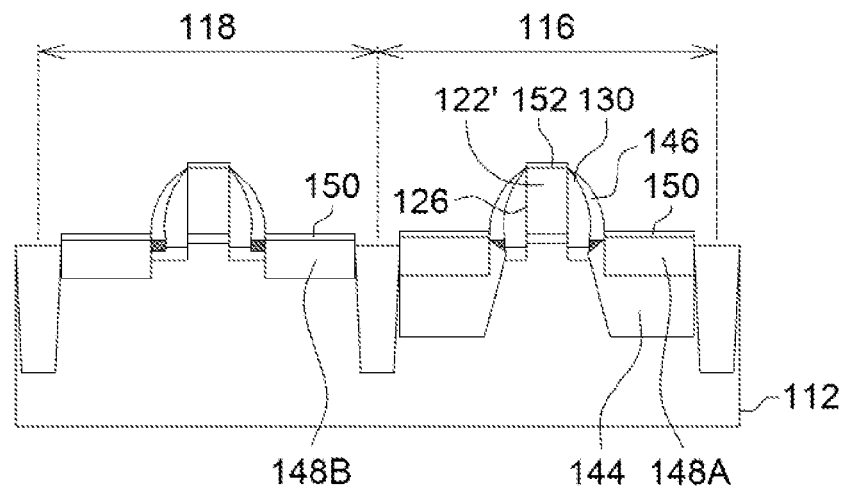

Referring to FIG. 11, the spacer 146 is formed on the spacer 130. The heavily doped region 148A is formed in the epitaxial layer 144 in the active region 116. The heavily doped region 148B is formed in the semiconductor substrate 112 in the active region 118. The metal silicide layer 150 is formed on the heavily doped region 148A and the heavily doped region 148B. A metal silicide layer 152 is formed on the patterned conductive layer 122' of the patterned gate layer 126.

Third Embodiment

The third embodiment is different from the first embodiment in that the lightly doped regions are formed after the sidewall layer and the cap layer are removed. FIG. 12 to FIG. 15 illustrate a method for manufacturing a semiconductor structure in the third embodiment. An earlier process in this embodiment is similar to a process shown in FIG. 1 to FIG. 3, and thus is not described in detail herein.

Figure 12:
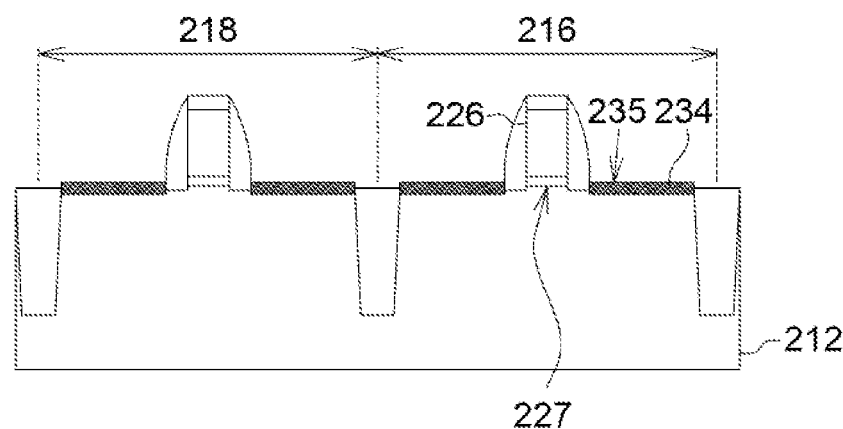
FIG. 12 to FIG. 15 illustrate a method for manufacturing a semiconductor structure in one embodiment.

Referring to FIG. 12, the compensation layer 234 is formed on the semiconductor substrate 212. The top surface 235 of the compensation layer 234 is higher than or as high as the interface 227 between the patterned gate layer 226 and the semiconductor substrate 212. The compensation layer 234 is an epitaxial material grown from the semiconductor substrate 212. The compensation layer 234 comprises a silicon containing material such as silicon, SiGe, SiC, doped silicon, etc.

Figure 13:
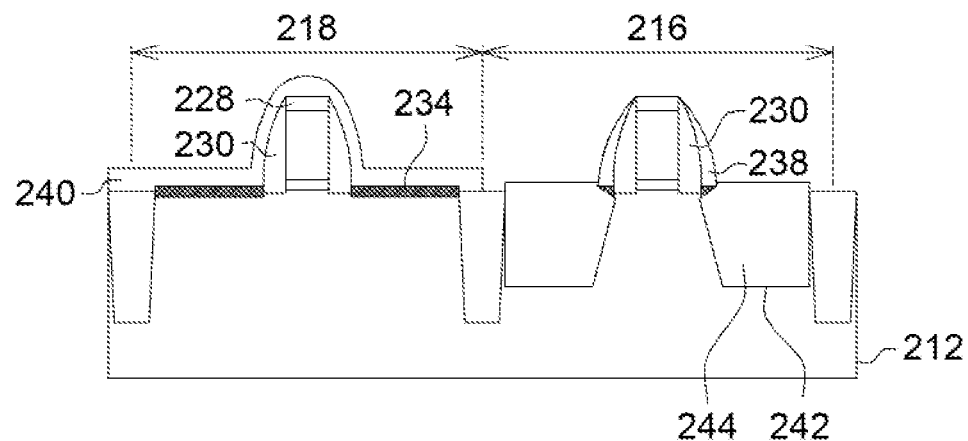

Referring to FIG. 13, the sidewall layer 238 is formed on the sidewall of the spacer 230, and the trench 242 is formed in the semiconductor substrate 212 in the active region 216. In addition, the material layer 240 is formed on the cap layer 228, the spacer 230, and the compensation layer 234 in the active region 218. The epitaxial layer 244 is formed in the trench 242.

Figure 14:
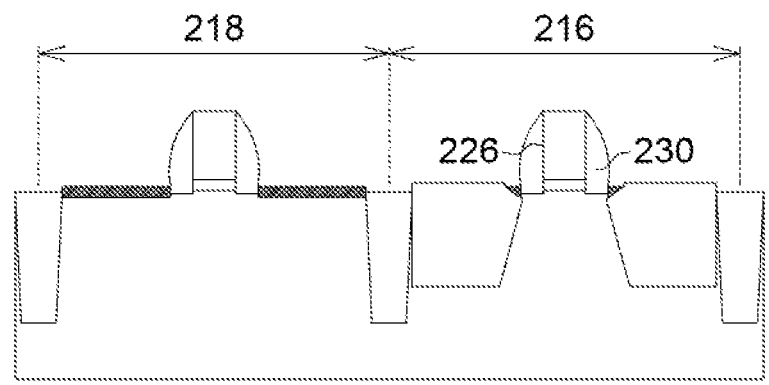

The sidewall layer 238, the material layer 240 and the cap layer 228 are removed by an etching step for forming the semiconductor structure as shown in FIG. 14. In one embodiment, the sidewall layer 238, the material layer 240 and the cap layer 228 have the same material such as silicon nitride, and are removed simultaneously in this etching step. In addition, this etching step may also remove a portion of the spacer 230 simultaneously, so that the spacer 230 is decreased to substantially lower slightly than or as high as the patterned gate layer 226.

Figure 15:
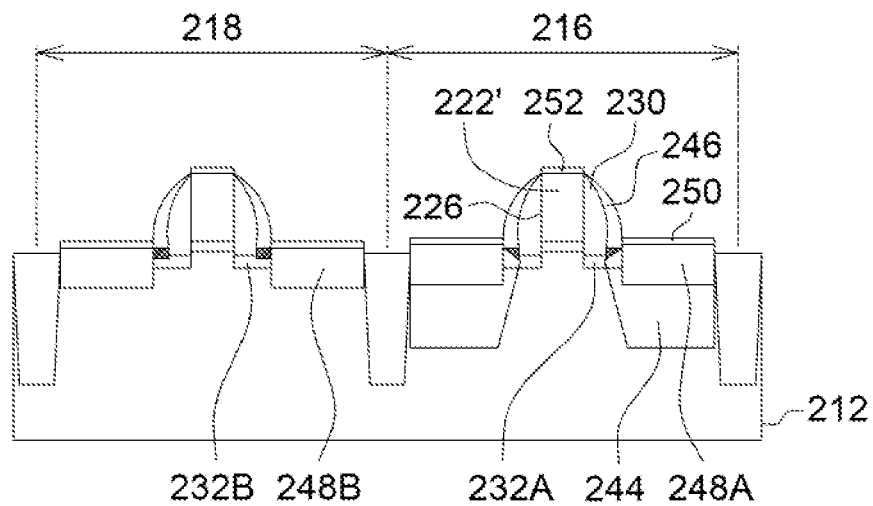

Referring to FIG. 15, then, the lightly doped region 232A is formed in the semiconductor substrate 212 and the epitaxial layer 244 in the active region 216. The lightly doped region 232B is formed in the semiconductor substrate 212 in the active region 218. Sequence of the step for forming the lightly doped region 232A and the step for forming the lightly doped region 232B is not limited. The lightly doped region 232B may be formed after the lightly doped region 232A. Alternatively, the lightly doped region 232B may be formed before the lightly doped region 232A. Since the lightly doped region 232A and the lightly doped region 232B are formed after the cap layer 228 and the sidewall layer 238 (FIG. 13), the shadow effect can be avoided.

Referring to FIG. 15, the spacer 246 is formed on the spacer 230. The heavily doped region 248A is formed in the epitaxial layer 244 in the active region 216. The heavily doped region 248B is formed in the semiconductor substrate 212 in the active region 218. The metal silicide layer 250 is formed on the heavily doped region 248A and the heavily doped region 248B. The metal silicide layer 252 is formed on the patterned conductive layer 222' of the patterned gate layer 226.

Fourth Embodiment

The fourth embodiment is different from the second embodiment in that the step for forming the compensation layer is between the step for removing the sidewall layer and the step for removing the cap layer. FIG. 16 to FIG. 21 illustrate a method for manufacturing a semiconductor structure in the third embodiment. An earlier process in this embodiment is similar to a process shown in FIG. 1 to FIG. 3, and thus is not described in detail herein.

Figure 16:
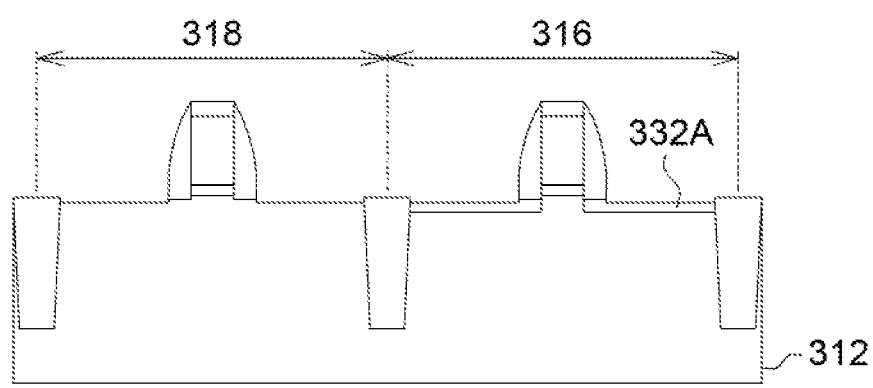
FIG. 16 to FIG. 21 illustrate a method for manufacturing a semiconductor structure in one embodiment.

Referring to FIG. 16, the lightly doped region 332A is formed in the semiconductor substrate 312 in the active region 316.

Figure 17:
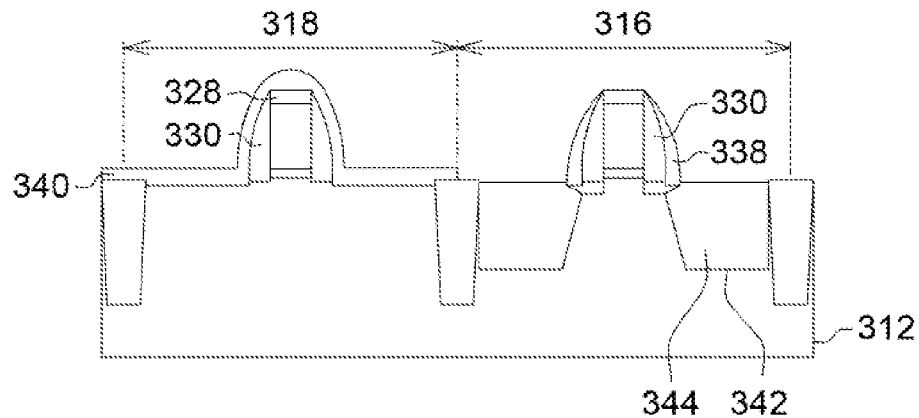

Referring to FIG. 17, the sidewall layer 338 is formed on the sidewall of the spacer 330, and the trench 342 is formed in the semiconductor substrate 312 in the active region 316. In addition, the material layer 340 is formed on the cap layer 328, the spacer 330, and the semiconductor substrate 312 in the active region 318. The epitaxial layer 344 is formed in the trench 342.

Figure 18:
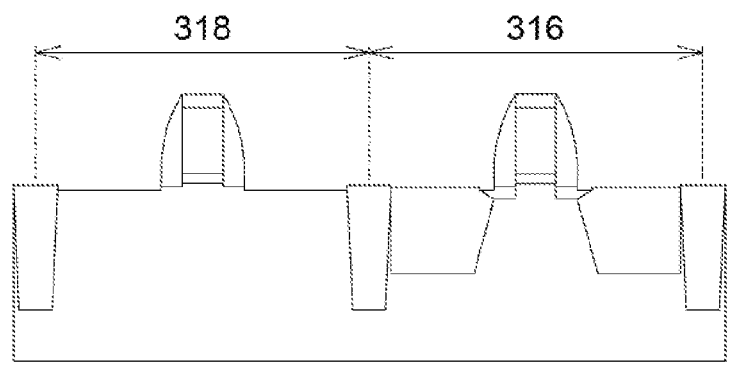

The sidewall layer 338 and the material layer 340 are removed by an etching step for forming the semiconductor structure as shown in FIG. 18.

Figure 19:
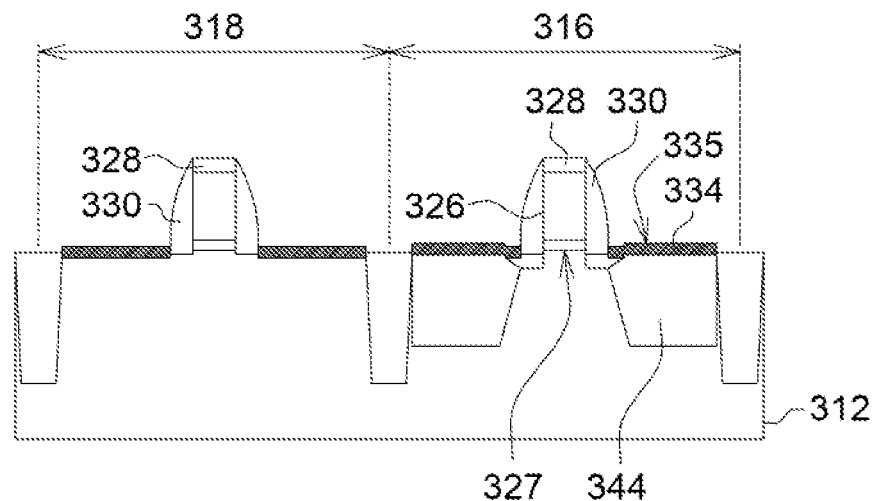

Referring to FIG. 19, the compensation layer 334 is formed on the semiconductor substrate 312 and the epitaxial layer 344. The compensation layer 334 is an epitaxial material grown from the semiconductor substrate 312 and the epitaxial layer 344. The compensation layer 334 comprises a silicon containing material such as silicon, SiGe, SiC, doped silicon, etc. The top surface 335 of the compensation layer 334 is higher than or as high as the interface 327 between the patterned gate layer 326 and the semiconductor substrate 312.

Figure 20:
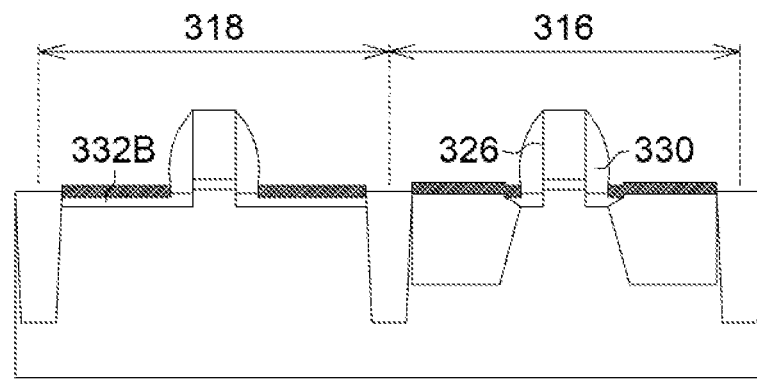

Then, the cap layer 328 is removed by an etching step for forming the semiconductor structure as shown in FIG. 20. In one embodiment, this etching step also remove a portion of the spacer 330 simultaneously, so that the spacer 330 is decreased to substantially lower slightly than or as high as the patterned gate layer 326.

The lightly doped region 332B is then formed in the semiconductor substrate 312 in the active region 318. Since the lightly doped region 332B is formed after the sidewall layer 338 (FIG. 17) and the cap layer 328 (FIG. 19), the shadow effect can be avoided.

Figure 21:
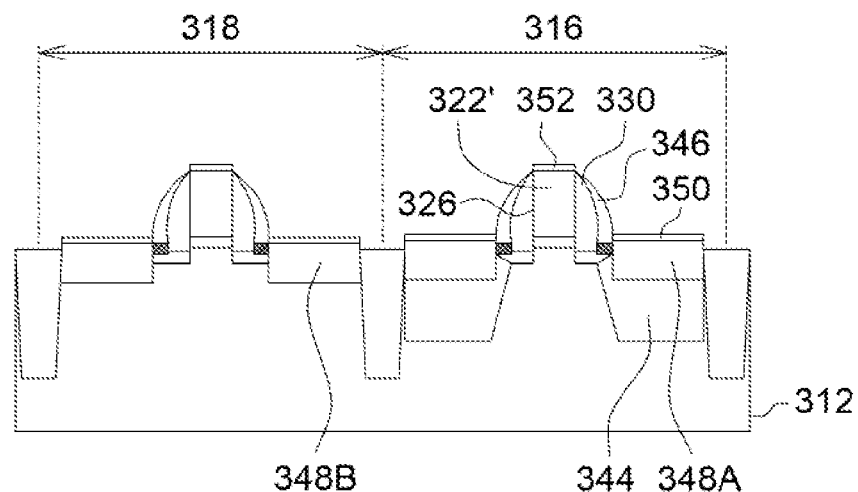

Referring to FIG. 21, the spacer 346 is formed on the spacer 330. The heavily doped region 348A is formed in the epitaxial layer 344 in the active region 316. The heavily doped region 348B is formed in the semiconductor substrate 312 in the active region 318. The metal silicide layer 350 is formed on the heavily doped region 348A and the heavily doped region 348B. The metal silicide layer 352 is formed on the patterned conductive layer 322' of the patterned gate layer 326.

Fifth Embodiment

The fifth embodiment is different from the third embodiment in that the step for forming the compensation layer is between the step for removing the sidewall layer and the step for removing the cap layer. FIG. 22 to FIG. 26 illustrate a method for manufacturing a semiconductor structure in the third embodiment. An earlier process in this embodiment is similar to a process shown in FIG. 1 to FIG. 3, and thus is not described in detail herein.

Figure 22:
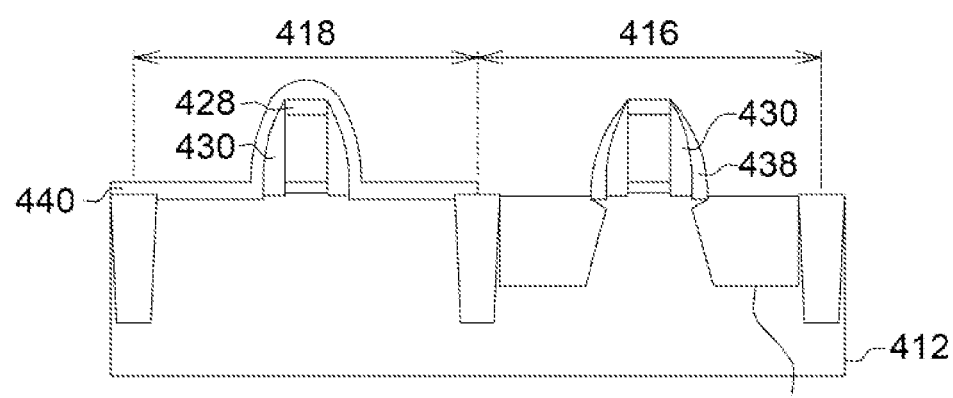
FIG. 22 to FIG. 26 illustrate a method for manufacturing a semiconductor structure in one embodiment.

Referring to FIG. 22, the sidewall layer 438 is formed on the sidewall of the spacer 430, and the trench 442 is formed in the semiconductor substrate 412 in the active region 416. In addition, the material layer 440 is formed on the cap layer 428, the spacer 430, and the semiconductor substrate 412 in the active region 418. The epitaxial layer 444 is formed in the trench 442.

Figure 23:
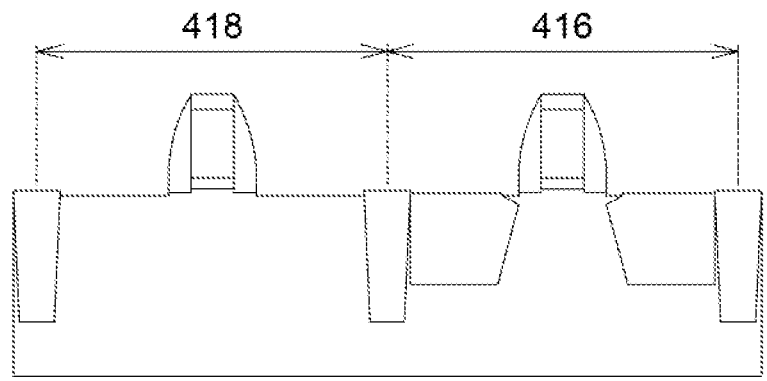

The sidewall layer 438 and the material layer 440 are removed by an etching step for forming the semiconductor structure as shown in FIG. 23.

Figure 24:
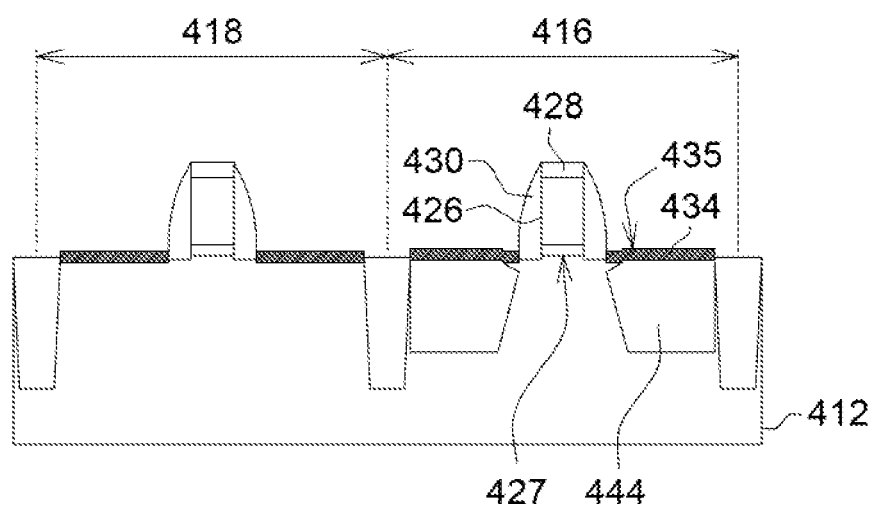

Referring to FIG. 24, the compensation layer 434 is formed on the semiconductor substrate 412 and the epitaxial layer 444. The compensation layer 434 is an epitaxial material grown from the semiconductor substrate 412 and the epitaxial layer 444. The compensation layer 434 comprises a silicon containing material such as silicon, SiGe, SiC, doped silicon, etc. The top surface 435 of the compensation layer 434 is higher than or as high as the interface 427 between the patterned gate layer 426 and the semiconductor substrate 412.

Figure 25:
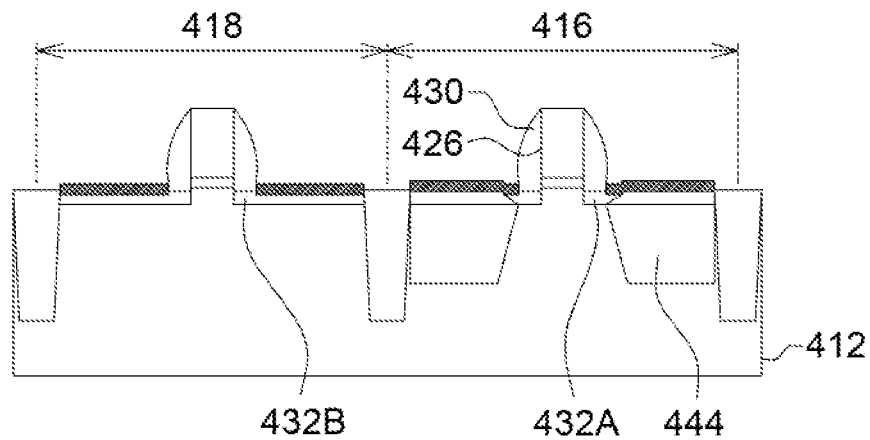

Then, the cap layer 428 is removed by an etching step for forming the semiconductor structure as shown in FIG. 25. In one embodiment, this etching step also remove a portion of the spacer 430 simultaneously, so that the spacer 430 is decreased to substantially lower slightly than or as high as the patterned gate layer 426.

Referring to FIG. 25, the lightly doped region 432A is then formed in the semiconductor substrate 412 and the epitaxial layer 444 in the active region 416. In addition, the lightly doped region 432B is formed in the semiconductor substrate 412 in the active region 418. Sequence of the step for forming the lightly doped region 432A and the step for forming the lightly doped region 432B is not limited. The lightly doped region 432B may be formed after the lightly doped region 432A. Alternatively, the lightly doped region 432B may be formed before the lightly doped region 432A. Since the lightly doped region 432A and the lightly doped region 432B are formed after the sidewall layer 438 (FIG. 22) and the cap layer 428 (FIG. 24), the shadow effect can be avoided.

Figure 26:
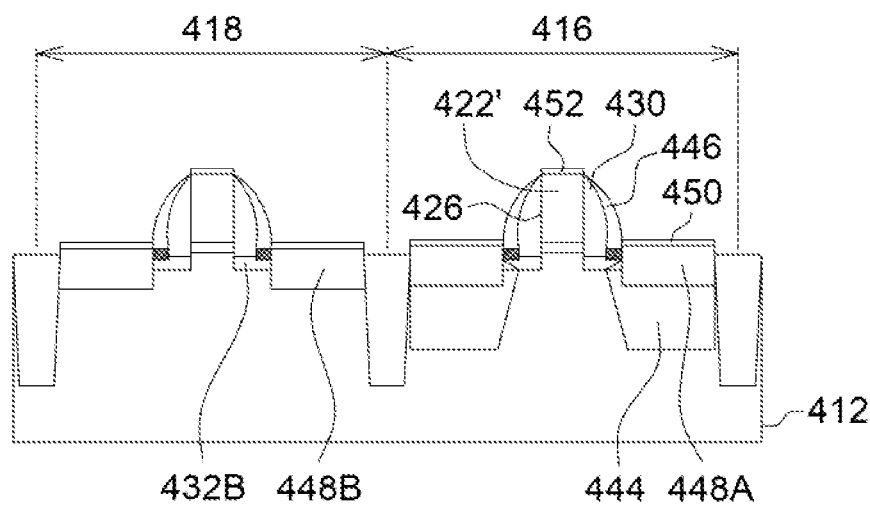

Referring to FIG. 26, the spacer 446 is formed on the spacer 430. The heavily doped region 448A is formed in the epitaxial layer 444 in the active region 416. The heavily doped region 448B is formed in the semiconductor substrate 412 in the active region 418. The metal silicide layer 450 is formed on the heavily doped region 448A and the heavily doped region 448B. The metal silicide layer 452 is formed on the patterned conductive layer 422' of the patterned gate layer 426.

Sixth Embodiment

Figure 27:
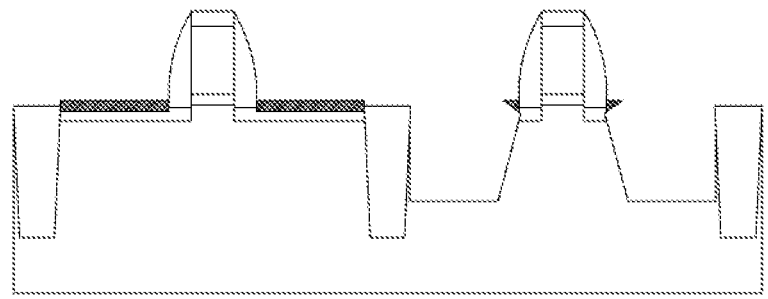
FIG. 27 to FIG. 28 illustrate a method for manufacturing a semiconductor structure in one embodiment.
Figure 28:
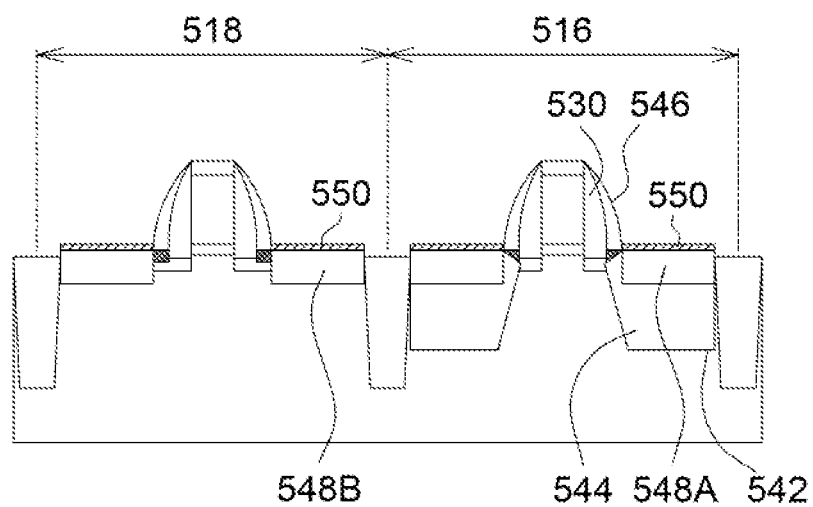

FIG. 27 to FIG. 28 illustrate a method for manufacturing a semiconductor structure in the sixth embodiment. The sixth embodiment is different from the first embodiment in that after the step shown in FIG. 6, the material layer 40 and the sidewall layer 38 in FIG. 6 are removed simultaneously by an etching step using phosphoric acid for forming the semiconductor structure shown in FIG. 27.

Next, referring to FIG. 28, the epitaxial layer 544 is formed in the trench 542. The spacer 546 is then formed on the spacer 230. Next, the heavily doped region 548A is formed in the epitaxial layer 544 in the active region 516. The heavily doped region 548B is formed in the semiconductor substrate 512 in the active region 518. The metal silicide layer 550 is formed on the heavily doped region 548A and the heavily doped region 548B.

According to foregoing embodiments, the compensation layer can compensate losses of the substrate material generated in the removing steps. Therefore, a PN junction of a device can be controlled at a predetermined position and the efficiency of the device is improved. The compensation layer is not limited to the formation timing illustrated in the foregoing embodiments. In some cases, a plurality of compensation layers can be formed at different formation timings. In other words, for example, a plurality of compensation layers can be formed at an optional combination of formation timings illustrated in embodiments.

While the disclosure has been described by way of example and in terms of the exemplary preferred embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for manufacturing a semiconductor structure, comprising:
    forming a patterned gate layer on a semiconductor substrate;
    forming a compensation layer on the semiconductor substrate outside the patterned gate layer, wherein the compensation layer comprises silicon, SiGe, SiC, doped silicon;
    forming a trench in the compensation layer and the semiconductor substrate; and forming an epitaxial layer in the trench, wherein the step for forming the compensation layer is between the step for forming the patterned gate layer and the step for forming the epitaxial layer.

2. The method for manufacturing the semiconductor structure according to claim 1, wherein the compensation layer is a silicon containing epitaxial material grown from the semiconductor substrate.

3. The method for manufacturing the semiconductor structure according to claim 1, wherein the patterned gate layer and the semiconductor substrate has an interface therebetween, in the step for forming the compensation layer, a top surface of the compensation layer is higher than or as high as the interface.

4. The method for manufacturing the semiconductor structure according to claim 1, further comprising forming a lightly doped region in the semiconductor substrate adjacent to the patterned gate layer, wherein the step for forming the compensation layer is between the step for forming the patterned gate layer and the step for forming the lightly doped region.

5. The method for manufacturing the semiconductor structure according to claim 1, further comprising forming a lightly doped region in the semiconductor substrate adjacent to the patterned gate layer, wherein the step for forming the compensation layer is between the step for forming the lightly doped region and the step for forming the epitaxial layer.

6. The method for manufacturing the semiconductor structure according to claim 1, further comprising:
    forming a cap layer on the patterned gate layer;
    forming a sidewall layer on sidewalls of the patterned gate layer and the cap layer;
    removing the sidewall layer;
    removing the cap layer; and
    forming a lightly doped region in the semiconductor substrate adjacent to the patterned gate layer.

7. The method for manufacturing the semiconductor structure according to claim 6, wherein the step for forming the lightly doped region is after the step for removing the sidewall layer and the step for removing the cap layer.

8. The method for manufacturing the semiconductor structure according to claim 7, wherein the step for removing the sidewall layer and the step for removing the cap layer are performing simultaneously.

9. The method for manufacturing the semiconductor structure according to claim 6, wherein the step for forming the lightly doped region is before the step for removing the sidewall layer and the step for removing the cap layer.

10. The method for manufacturing the semiconductor structure according to claim 6, the step for removing the sidewall layer and the step for removing the cap layer are performing simultaneously.

11. The method for manufacturing the semiconductor structure according to claim 1, further comprising forming a spacer on a sidewall of the patterned gate layer, wherein the step for forming the compensation layer is between the step for forming the spacer and the step for forming the epitaxial layer.

12. A method for manufacturing a semiconductor structure, comprising:
    forming a patterned gate layer and a cap layer on a semiconductor substrate, wherein the cap layer is on the patterned gate layer;
    forming a sidewall layer on sidewalls of the patterned gate layer and the cap layer;
    removing the sidewall layer;
    forming a compensation layer on the semiconductor substrate outside the patterned gate layer, wherein the compensation layer comprises silicon, SiGe, SiC, doped silicon; and
    removing the cap layer, wherein the step for forming the compensation layer is between the step for removing the sidewall layer and the step for removing the cap layer.

13. The method for manufacturing the semiconductor structure according to claim 12, wherein the step for removing the cap layer is after the step for removing the sidewall layer.

14. The method for manufacturing the semiconductor structure according to claim 12, wherein the compensation layer is a silicon containing epitaxial material grown from the semiconductor substrate.

15. The method for manufacturing the semiconductor structure according to claim 12, wherein the patterned gate layer and the semiconductor substrate have an interface therebetween, in the step for forming the compensation layer, a top surface of the compensation layer is higher than or as high as the interface.

16. The method for manufacturing the semiconductor structure according to claim 12, further comprising forming a lightly doped region in the semiconductor substrate adjacent to the patterned gate layer, wherein the step for forming the lightly doped region is between the step for forming the patterned gate layer and the step for removing the sidewall layer.

17. The method for manufacturing the semiconductor structure according to claim 12, further comprising forming a lightly doped region in the semiconductor substrate adjacent to the patterned gate layer, wherein the step for forming the lightly doped region is after the step for removing the sidewall layer and the step for removing the cap layer.

18. The method for manufacturing the semiconductor structure according to claim 12, further comprising:
    forming a trench in the semiconductor substrate outside the patterned gate layer, wherein the step for forming the trench and the step for forming the sidewall layer are performed simultaneously; and
    forming an epitaxial layer in the trench.

* * * * *